United States Patent
McClain et al.

[11] Patent Number: 6,123,251
[45] Date of Patent: Sep. 26, 2000

[54] APPARATUS AND METHOD FOR SOLDERING

[75] Inventors: Sean M. McClain, Havertown; Vladimir K. Tamarkin, Huntingdon Valley, both of Pa.

[73] Assignee: Unisys Corporation, Blue Bell, Pa.

[21] Appl. No.: 09/439,754

[22] Filed: Nov. 15, 1999

[51] Int. Cl.[7] .............................. B23K 31/02; B23K 3/06; B23K 35/14; B23K 35/38; H05B 1/00

[52] U.S. Cl. ...................... 228/180.1; 228/56.1; 228/219; 219/233

[58] Field of Search ................................. 228/180.1, 214, 228/191, 219, 262, 33, 36, 56.1, 56.2; 219/233, 227, 240; 156/579

[56] References Cited

U.S. PATENT DOCUMENTS

| | | | |
|---|---|---|---|
| 3,616,984 | 11/1971 | Voroba | 228/33 |
| 4,162,034 | 7/1979 | Pavlas | 228/37 |
| 4,437,605 | 3/1984 | Tucker et al. | 228/180 |
| 4,717,064 | 1/1988 | Popielarski et al. | 228/39 |
| 4,779,790 | 10/1988 | Wallgren et al. | 228/180.1 |
| 4,858,816 | 8/1989 | Gontier | 228/34 |
| 4,981,248 | 1/1991 | Hall | 228/8 |
| 5,128,506 | 7/1992 | Dahne et al. | 219/85.13 |
| 5,220,147 | 6/1993 | Spigarelli et al. | 219/85.1 |
| 5,340,013 | 8/1994 | Poole et al. | 228/119 |
| 5,361,969 | 11/1994 | Gileta | 228/180.1 |
| 5,397,049 | 3/1995 | Gileta et al. | 228/37 |
| 5,617,990 | 4/1997 | Thompson, Sr. | 228/180.1 |
| 5,704,535 | 1/1998 | Thompson, Sr. | 228/39 |
| 5,785,237 | 7/1998 | Lasto et al | 228/180.22 |
| 5,864,118 | 1/1999 | Backlund | 219/233 |

*Primary Examiner*—Patrick Ryan
*Assistant Examiner*—Zidia Pittman
*Attorney, Agent, or Firm*—Rocco L. Adornato; Mark T. Starr; Lisa A. Rode

[57] ABSTRACT

A solder head is adapted to direct the flow of solder from a solder fountain. The solder head includes a wall forming a passage through which solder can flow upwardly and having an edge portion over which solder can flow from the passage. The solder head also includes a shield connected to the wall. The shield and the wall at least partially define an overflow passage through which solder can flow downwardly. The shield is configured to prevent contact between solder and an electronic component adjacent the solder head. Corresponding soldering systems and soldering methods are also provided.

20 Claims, 7 Drawing Sheets

APPARATUS AND METHOD FOR SOLDERING

FIELD OF THE INVENTION

This invention relates to an apparatus and method for soldering. More specifically, this invention relates to a solder head adapted to direct the flow of solder from a solder fountain, a system for soldering a component to a circuit board, and a method for soldering a component to a circuit board and for preventing contact between solder and an adjacent component.

BACKGROUND OF THE INVENTION

Components on printed circuit board assemblies are frequently soldered into place using a solder fountain machine. For example, such solder fountain machines provide molten solder and urge the solder into contact with the electrical leads of electronic components such as integrated circuit chips. Also, solder fountain machines are used to connect various mechanical and electromechanical components to printed circuit boards (e.g., brackets, connectors, resistors, capacitors, etc.). Such solder fountain machines have been advantageously used in the past as an efficient tool for producing printed circuit board assemblies.

One example of a solder fountain technique will be described with reference to FIG. 1 to illustrate disadvantages that may be associated with conventional solder fountain techniques. The printed circuit board assembly 10 illustrated in FIG. 1 includes a printed circuit board 12. An electronic component 14 having component leads 16 is connected to the printed circuit board 12 by means of a solder fountain machine. Electronic component 14 is positioned adjacent a surface of the printed circuit board 12, and adjacent electronic components 18 are positioned adjacent an opposite surface of printed circuit board 12. The component leads 16 of electronic component 14 extend through printed circuit board 12 so that they can be connected by solder at the opposite side.

Using solder fountain head 20, molten solder is urged upwardly, thereby producing solder overflow 22. Although the solder contacts the component leads 16 of electronic component 14 so as to create a solder bond between the electronic component 14 and the printed circuit board 12, it has been recognized that solder overflow 22 sometimes contacts adjacent electronic components 18. An example of such solder overflow spilling onto adjacent components is illustrated at location 24 in FIG. 1.

Because it has been recognized that solder may spill onto an adjacent component such as at location 24, there is a limit as to how close adjacent components may be placed to one another when fountain soldering techniques are utilized. This limit is reached, for example, when overflow from the solder fountain spills onto adjacent components during soldering processes. It will be appreciated that contact between hot solder and electronic component bodies is highly undesirable. As such, component spacing on printed circuit board assemblies has been limited in that it cannot be smaller than the distance at which solder overflow begins to spill onto adjacent components.

In an attempt to overcome this acknowledged problem, it has been proposed to apply tape to the adjacent components before soldering. The tape is intended to prevent direct contact between the solder and the adjacent components during fountain soldering procedures. Referring to FIG. 2, for example, a printed circuit board assembly 100, like printed circuit board assembly 10, includes a printed circuit board 112 to which an electronic component 114 having component leads 116 is mounted. Electronic components 118 are mounted adjacent to electronic component 114 on the opposite surface of printed circuit board 112. A solder fountain head 120 produces solder overflow 122. Unlike circuit board assembly 10, printed circuit board assembly 100 includes high temperature tape 126 over each of the adjacent electronic components 118. As is illustrated at locations 124, solder overflow spills onto the tape 126, and the tape 126 is intended to prevent direct contact between the solder and the adjacent electronic components 118.

The use of tape for masking adjacent components has several shortcomings. Firstly, the use of masking tape such as tape 124 is associated with a high labor cost. The tape can be difficult to apply, and it should be applied to every component by a skilled technician. The use of masking tape is also associated with increased manufacturing time because the masking operation requires significant time for both tape application and removal processes. The tape masking procedure is also associated with questionable reliability in that the tape does not always stay in place during the soldering process. Accordingly, if the tape allows solder to contact the body of an adjacent component, that component may require replacement. The use of tape for masking also has questionable effectiveness in that the tape has limited thermal insulative properties. For example, if significant heat passes through the tape, it could damage the component even if the molten solder does not directly contact the component.

Accordingly, there remains a need for an apparatus and method for soldering that can overcome the disadvantages associated with prior art soldering techniques.

SUMMARY OF THE INVENTION

This invention provides a solder head adapted to direct the flow of solder from a solder fountain. The solder head includes a wall forming a passage through which solder can flow upwardly and having an edge portion over which solder can flow from the passage. The solder head also includes a shield connected to the wall, wherein the shield and the wall at least partially define an overflow passage through which solder can flow downwardly. The shield is configured to prevent contact between solder and a component proximal the solder head.

A system for soldering a component to a circuit board is also provided. The system includes a solder fountain. A solder head is connected to the solder fountain. The solder head includes a wall and a shield connected to the wall. The solder head is positionable proximal the circuit board to facilitate soldering of the component to the circuit board. The shield is positionable between the wall of the solder head and an adjacent component to prevent contact between solder flowing over the wall of the solder head and the adjacent component.

A corresponding method is also provided. According to the method, a solder fountain is provided, and a solder head is connected to the solder fountain, wherein the solder head includes a wall and a shield. The solder head is positioned proximal the circuit board with the shield being positioned between the wall of the solder head and the adjacent component. Solder is urged upwardly thorough the passage formed by the wall, over an edge portion of the wall, and downwardly through an overflow passage defined between the wall and the shield, thereby preventing contact between the solder flowing over the edge portion of the wall and the adjacent component.

BRIEF DESCRIPTION OF THE DRAWINGS

The invention will be described with reference to exemplary embodiments illustrated in the figures, of which.

DETAILED DESCRIPTION OF THE INVENTION

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the dimensions described hereafter can be modified within the scope of this invention.

Figure 1:
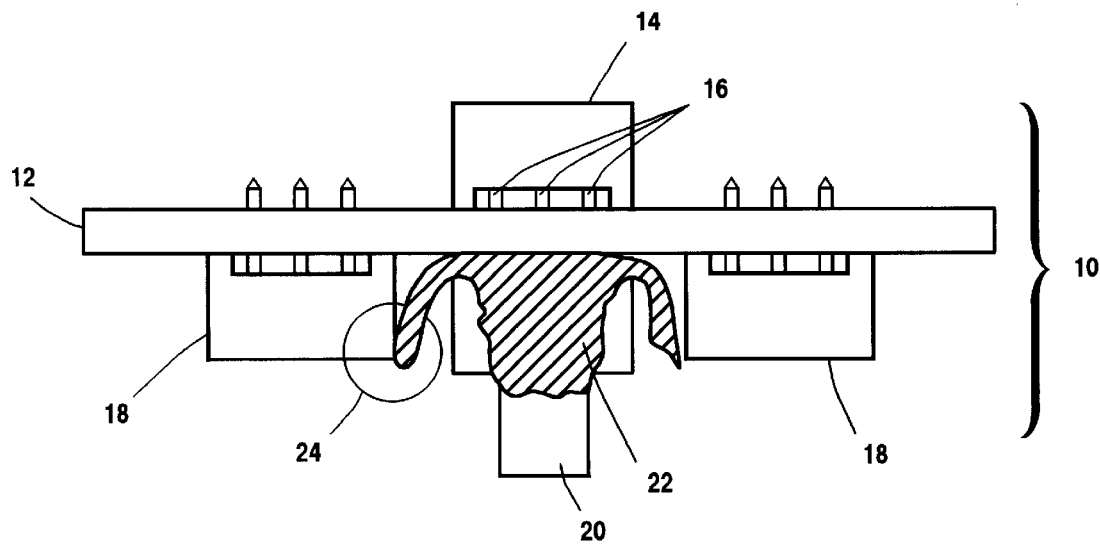
FIG. 1 is an end view of an embodiment of a printed circuit board assembly.
Figure 2:
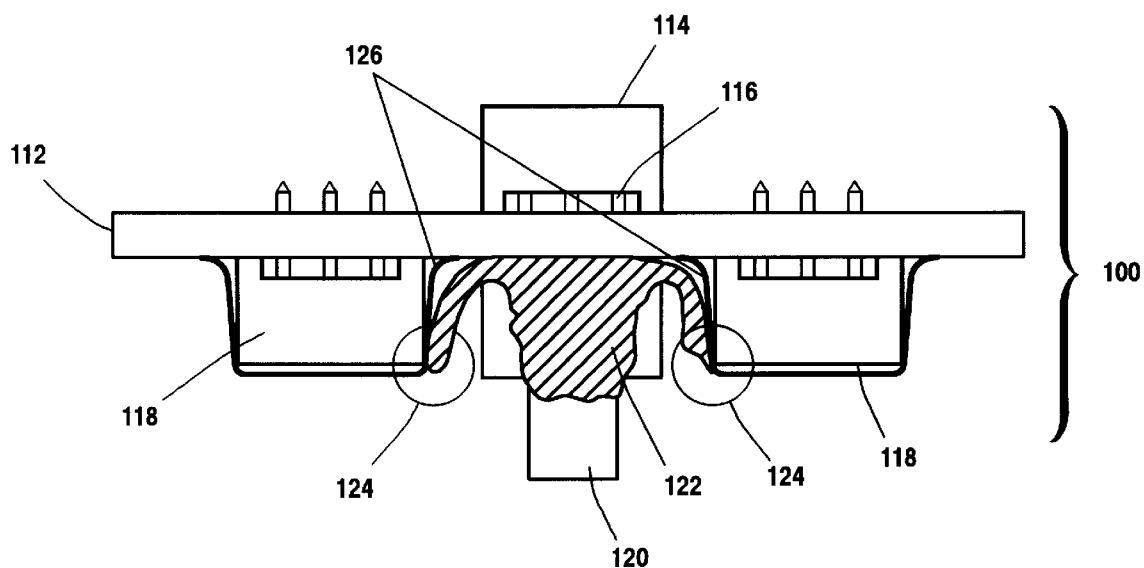
FIG. 2 is an end view of another embodiment of a printed circuit board assembly.
Figure 3:
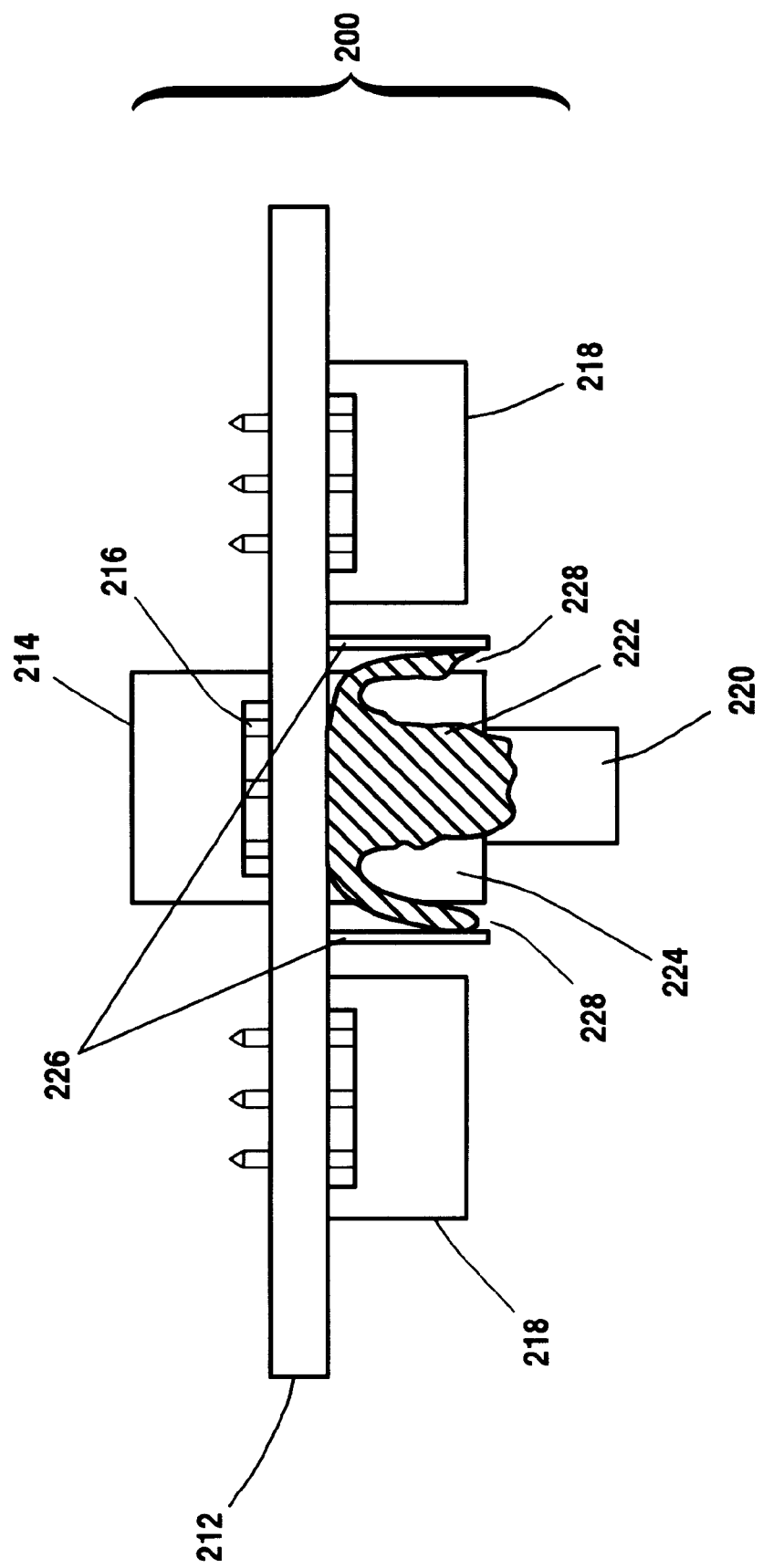
FIG. 3 is an end view of an embodiment of a printed circuit board assembly according to this invention.

Generally, this invention provides a solder head adapted to direct the flow of solder from a solder fountain. Referring for example to the schematic representation shown in FIG. 3, a printed circuit board assembly 200 includes a printed circuit board 212 to which an electronic component 214 having component leads 216 is mounted. Adjacent electronic components 218 are mounted to an opposite surface of circuit board 212 from electronic component 214. A solder fountain head 220 is used to make the solder connection between electronic component 214 and circuit board 212. Solder overflow 222 flows over wall 224.

More specifically, the solder head 220 includes a wall 224 forming a passage through which solder can flow upwardly and having an edge portion over which solder can flow in the form of solder overflow 222 from the passage. One or more shields, such as shields 226, are connected to the wall 224. Each shield 226 and the wall 224 at least partially define an overflow passage, such as overflow passages 228, through which solder can flow downwardly. The shield 226 is configured to prevent contact between solder and an electronic component, such as adjacent electronic component 218, that are positioned adjacent the solder head 220.

The solder head according to this invention allows closer spacing of components that are intended to undergo fountain soldering. It does so by providing shields between the solder fountain head and adjacent components, such as shown schematically in FIG. 3. As will be described later in further detail, the shields may be attached to the solder fountain head or they may be an integral part of the solder fountain head, such that solder may flow between the head and the shields, but the solder preferably will not exceed the shield boundaries.

The shields are preferably made of material that will reduce or prevent damage to the adjacent components due to radiant or convective heat transfer from the shields. For example, a material with high thermal resistance would tend to insulate adjacent components from thermal damage. On the other hand, a material with low thermal resistance could also be used, so long as the shield surface closest to the adjacent component body does not transport a damaging rate of heat to the component body.

Figure 4:
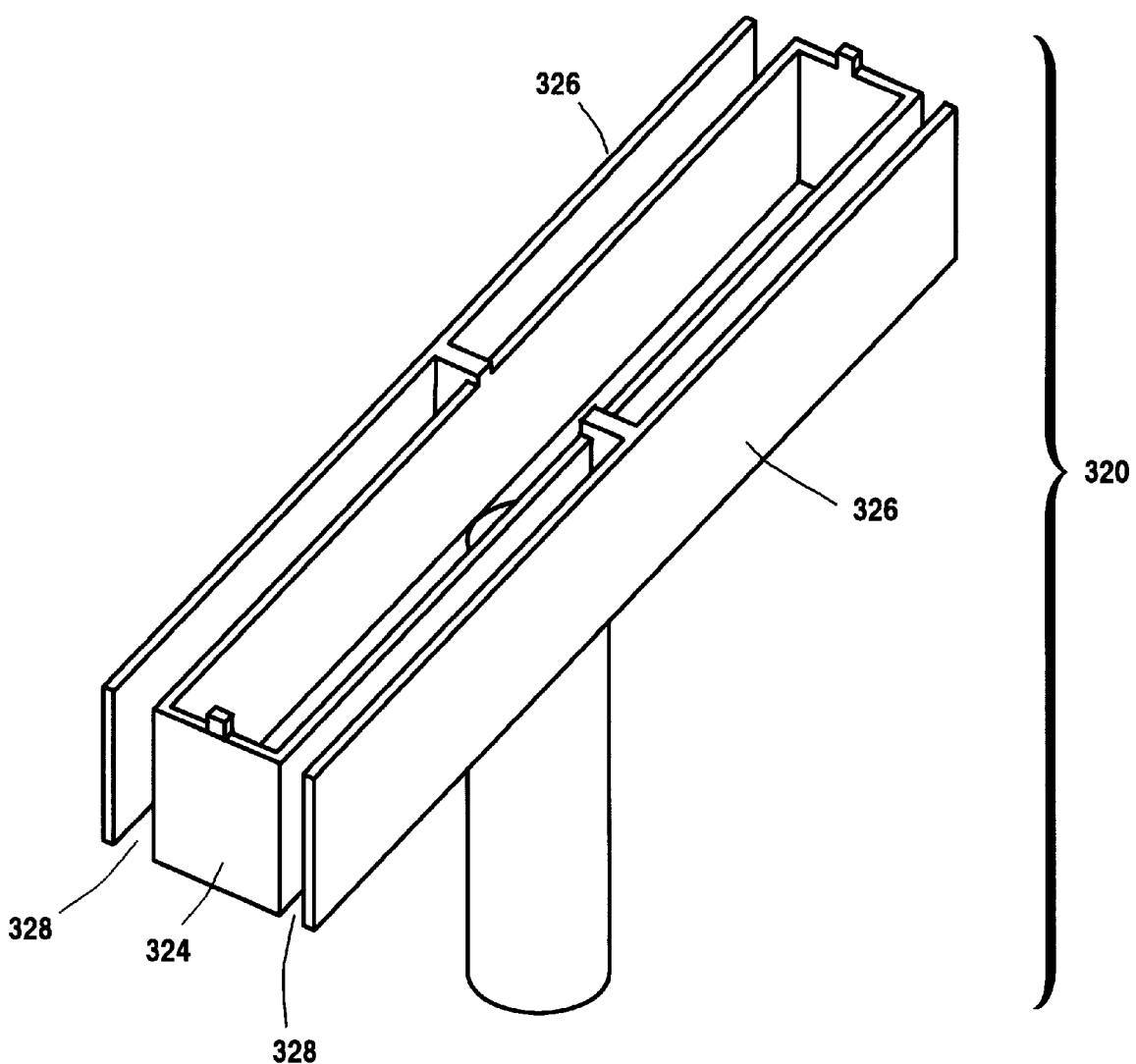
FIG. 4 is a perspective view of an embodiment of a solder fountain head according to this invention.

Preferred features of an exemplary solder fountain head will now be described with reference to FIGS. 4–9. Referring first to FIG. 4, a preferred solder fountain head 320 is similar to solder fountain head 220 in that it includes a wall 324, shields 326, and overflow passages 328 defined by the spaces between wall 324 and shields 326.

Figure 5:
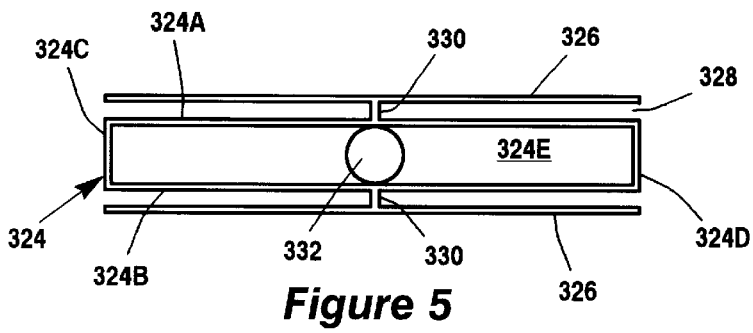
FIG. 5 is a top view of the solder fountain head shown in FIG. 4.

As is illustrated in the top view in FIG. 5, wall 324 includes five wall portions 324A, 324B, 324C, 324D, and 324E. Wall portions 324A–324D form four sides of a rectangular passageway through which solder flows upwardly. Wall portion 324E forms a base portion of wall 324. A pair of opposed webs 330 extend outwardly between wall portions 324A and 324B and shields 326 in order to define overflow passages 328. Because of the central positioning of webs 330, each overflow passage 328 is divided in half. An inlet opening 332 is provided in wall portion 324E to permit the flow of molten solder upwardly into the passage defined by wall 324.

Figure 6:
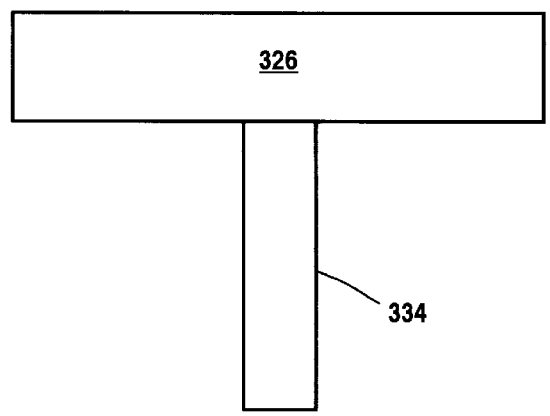
FIG. 6 is a side view of the solder fountain head shown in FIG. 4.

Referring now to the side view shown in FIG. 6, solder fountain head 320 includes a stem portion 334 connected to wall portion 324E of wall 324. The stem portion 334 facilitates connection of head 320 to a solder fountain machine (not shown). More specifically, stem portion 334 can be fit over an upwardly extending end of a smaller diameter stem of a solder fountain machine in telescoping relationship. The stem of the solder fountain machine extends upwardly from a solder pot that provides a source of molten solder. Accordingly, stem portion 334 provides a passage for upward solder flow that can enter the space between wall portions 324A–324E via inlet opening 332 (FIG. 5).

Solder fountain machines are available from various sources. One example of a solder fountain machine is available under Model No. M93E, from Wenesco, Inc., of Chicago, Ill.

Figure 7:
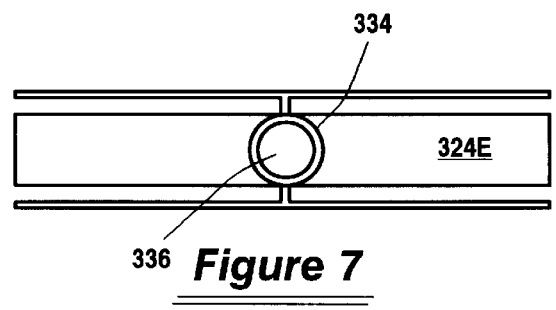
FIG. 7 is a bottom view of the solder fountain head shown in FIG. 4.

Referring now to FIG. 7, which provides a bottom view of solder fountain head 320, the passage for upward solder flow through stem portion 334 is designated by the numeral 336. It will be appreciated that stem portion 334 and passage 336 can be connected for flow communication with a source of molten solder (not shown). It should also be appreciated that solder overflow that travels downwardly through overflow passages 328 can then return to the source of molten solder or, alternatively, it can be discarded, or otherwise processed.

Figure 8:
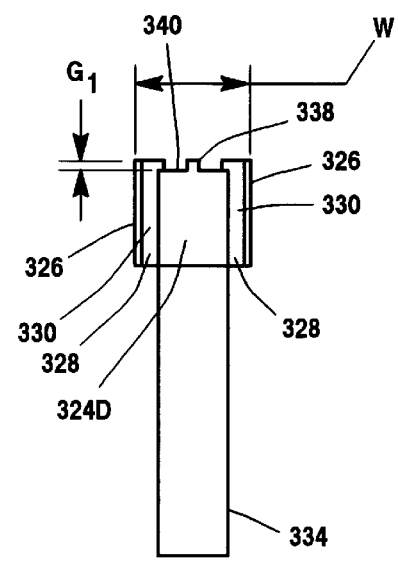
FIG. 8 is an end view of the solder fountain head shown in FIG. 4.

Referring now to FIG. 8, which shows an end view of solder fountain head 320, a detent 338 extends upwardly from an edge portion 340 of wall 324. More specifically, a detent 338 extends upwardly from the central portion of each of wall portions 324C and 324D of wall 324 (FIG. 5). When solder fountain head 320 is positioned proximal to or even contacting a surface of a printed circuit board, detents 338 ensure that a gap $G_1$ is maintained between the upper edge portion 340 of wall 324 and the surface of the printed circuit board. Gap $G_1$ is also defined by the extension of shields 326 upwardly a distance beyond upper edge portion 340 of wall 324. Detents 338 also provide stability when solder fountain head 320 is positioned adjacent a printed circuit board such as printed circuit board 312. Solder fountain head 320 is also provided with a width W measured from an outer edge of one shield 326 to an opposite outer edge of an opposite shield 326.

Figure 9:
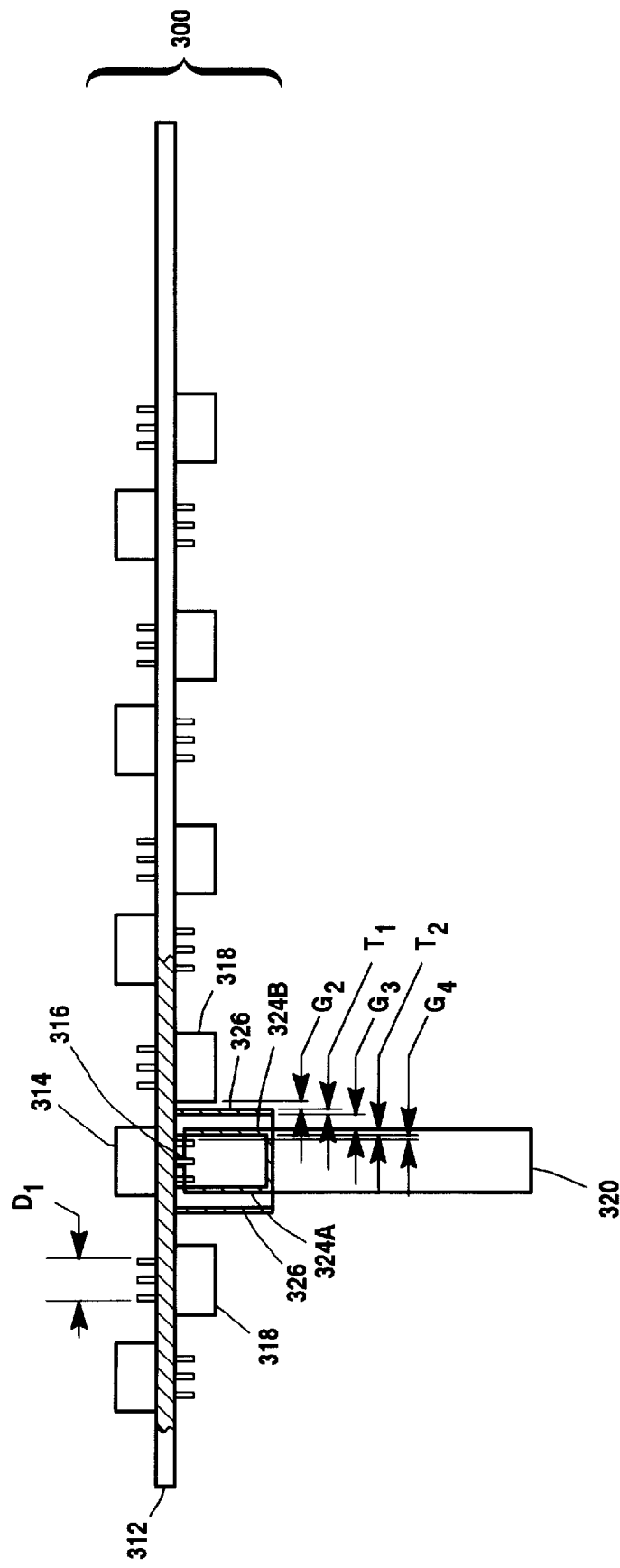
FIG. 9 is an end view of another embodiment of a printed circuit board assembly according to this invention, with a partial cross-sectional portion.

Referring now to FIG. 9, solder fountain head 320 is illustrated adjacent to a printed circuit board assembly 300. FIG. 9 includes a partial cross-sectional portion that extends through the circuit board 312 and through the solder fountain head 320 at a location between end wall portion 324D and stem 334.

Like printed circuit board assembly 200, assembly 300 includes a printed circuit board 312. An electronic component 314 having component leads 316 is mounted on a surface of printed circuit board 312 (an upper surface of board 312 as illustrated in FIG. 9). Printed circuit board assembly 300 also includes adjacent electronic components 318, which are mounted on an opposite surface of printed circuit board 312 (a bottom surface of printed circuit board 312 as illustrated in FIG. 9). The various component leads 316 of the electronic component 314 and the adjacent electronic component 318 are spread over a distance $D_1$. The space between the wall portions 324A and 324B (FIG. 5) of wall 324 of solder fountain head 320 is selected in order to accommodate the component leads 316, as is illustrated in FIG. 9.

Referring still to FIG. 9, a gap $G_2$ is preferably left between shield 326 and the edge of an adjacent electronic component 318. Such a gap $G_2$ reduces the heat transferred from solder (that may be flowing adjacent to the shield 326 in passage 328) to the adjacent electronic component 318. Also, a gap $G_2$ facilitates the maneuverability of solder fountain head 320 and printed circuit board 312 with respect to one another. For example, it is contemplated that the movement of solder fountain head 320 or circuit assembly 300 will be automated and that such movement will occur within certain tolerances. There will, however, be some small variations in the coordinates to which the solder fountain head 320 or assembly 300 are moved. There will also be some variability in the exact locations of adjacent electronic components 318 on printed circuit board 312. Therefore, gap $G_2$ accommodates such variations, thereby reducing the risk of contact between the solder fountain head 320 and an adjacent electronic component 318 when the solder fountain head 320 and printed circuit board 312 are brought into a position proximal one another. A variety of dimensions for gap $G_2$ can be selected, depending upon the size and location of components provided on the printed circuit board.

Each shield 326 is formed from a material having a thickness $T_1$. Thickness $T_1$ will vary depending the nature of the material selected for use as the shield as well as the particular application. Also, although various materials are contemplated for use in forming shields 326, steel is preferred. Nevertheless, a wide variety of materials can be used so long as they are capable of withstanding contact with molten solder, which may have a melting point of about 600° F. Also, the material selected to form the shields may be selected to have a high thermal resistance in order to insulate adjacent electronic components from thermal damage. On the other hand, a material with low thermal resistance may be used advantageously, so long as the shield surface closest to the adjacent component body does not transport a damaging rate of heat transfer to the component body.

As is illustrated in FIG. 9, a gap $G_3$ is defined between the inner surface of shield 326 and an outer surface of the wall 324 of the solder fountain head 320. It is this gap $G_3$ that provides a passage for the downward flow of overflow solder for return to the source of molten solder or for further processing. Gap $G_3$ should be of sufficient width to permit sufficient downward flow, aided by gravity, of the solder. On the other hand, gap $G_3$ will need to be minimized to prevent interference with adjacent electronic components 318. It is believed that an acceptable gap $G_3$ of about 0.180 inch may be suitable although other dimensions can be selected based on design preferences.

The wall 324 of solder fountain head 320 has a thickness $T_2$ as shown in FIG. 9. As with thickness $T_1$, of shield 326, thickness $T_2$ of wall 324 can be varied depending upon the material and application of a particular solder fountain head 320.

A gap $G_4$ is defined between an inner surface of wall 324 and an outer surface of an outer lead 316 of electronic component 314. Gap $G_4$ helps to ensure adequate application of molten solder to component leads 316 in the area of printed circuit board 312. Also, gap $G_4$ reduces the risk of physical interference between the solder fountain head 320 and component leads 316 when solder fountain head 320 and printed circuit board 312 are positioned adjacent one another. As described previously, there will be some tolerance as to the coordinate positioning of solder fountain head 320 or printed circuit board 312 as well as tolerances associated with the locations of electronic components 314 and 318 on printed circuit board 312.

As is illustrated most clearly in FIG. 9, when solder fountain head 320 is brought into contact with printed circuit board 312, a gap (gap $G_1$ in FIG. 8) is left between the edge portion of wall 324 of solder fountain head 320 and the bottom surface of printed circuit board 312. This gap $G_1$ permits the overflow of solder from within wall 324 into overflow passages 328. It should be noted that although shields 326 are shown to be contacting the bottom surface of printed circuit board 312 in FIG. 9, such contact is not necessary. For example, the uppermost surface of shields 326 can terminate at a plane corresponding to the edge portion of wall 324 so that the solder fountain head 320 terminates in that common plane. If so, the solder fountain apparatus can be programmed so that the head is spaced from the bottom surface of the printed circuit board 312 in order to provide a gap such as gap $G_1$. In other words, when solder head 320 and board 312 are brought to a position proximal one another, the upper surfaces of solder head 320 need not contact the bottom surface of printed circuit board 312.

Referring now to FIGS. 10A–10E, preferred features of a method according to this invention will now be described. Although solder fountain head 320 is illustrated in FIGS. 10B–10E, the solder fountain head 320 is depicted schematically without any shields 326 simply for purposes of illustration.

Figure 10A:
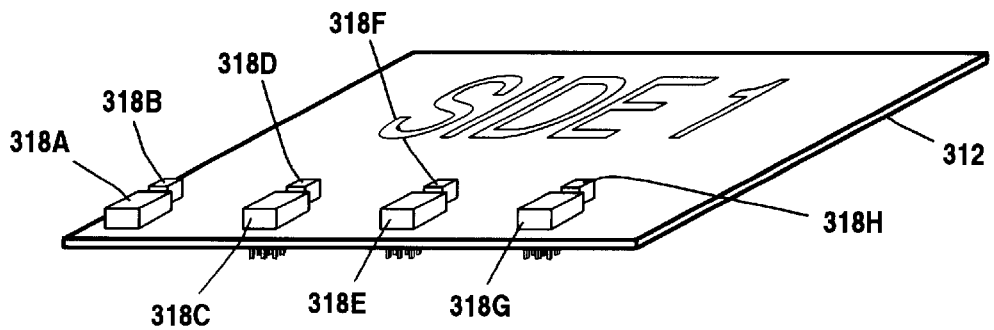
FIGS. 10A–10E are perspective views of a printed circuit board assembly, illustrating an embodiment of a method of soldering according to this invention.

Referring first to FIG. 10A, printed circuit board 312 is illustrated with eight (8) adjacent electronic components 318. More specifically, adjacent electronic components 318A–318H are mounted on "Side 1" of printed circuit board 312. The respective leads of adjacent electronic components 318A–318H extend through printed circuit board 312 for solder connection. In order to accomplish such soldering connection of electronic components 318A–318H, the Side 1 components 318A–318H can be soldered using a single pass procedure such as a wave soldering procedure.

Figure 10B:
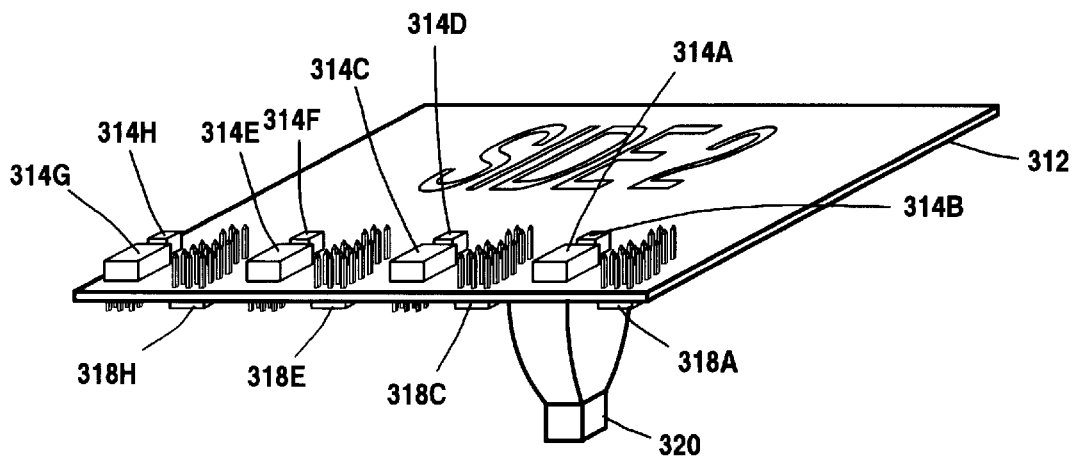

Referring now to FIG. 10B, printed circuit board 312 is now inverted so that "Side 2" is facing upwardly. Now, adjacent electronic components 318A–318H have leads extending upwardly from Side 2. A plurality of electronic components 314 are positioned on Side 2. Specifically, electronic components 314A–314H are positioned on Side 2 of printed circuit board 312 so that their respective component leads 316 extend downwardly through circuit board 312. A solder fountain head 320 of a solder fountain apparatus is positioned adjacent to the lower surface ("Side 1") of printed circuit board 312 in order to perform a fountain soldering procedure. More specifically, in the position illustrated in FIG. 10B, solder fountain head 320 is positioned at a location corresponding to electronic components 314A and 314B, which can be considered a first set of Side 2 components, to fountain solder the components 314A and 314B to the board 312.

Figure 10C:
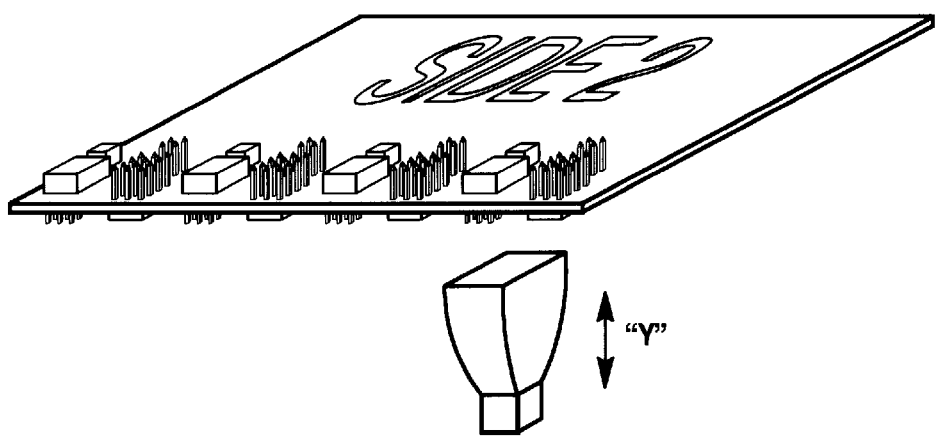
Figure 10D:
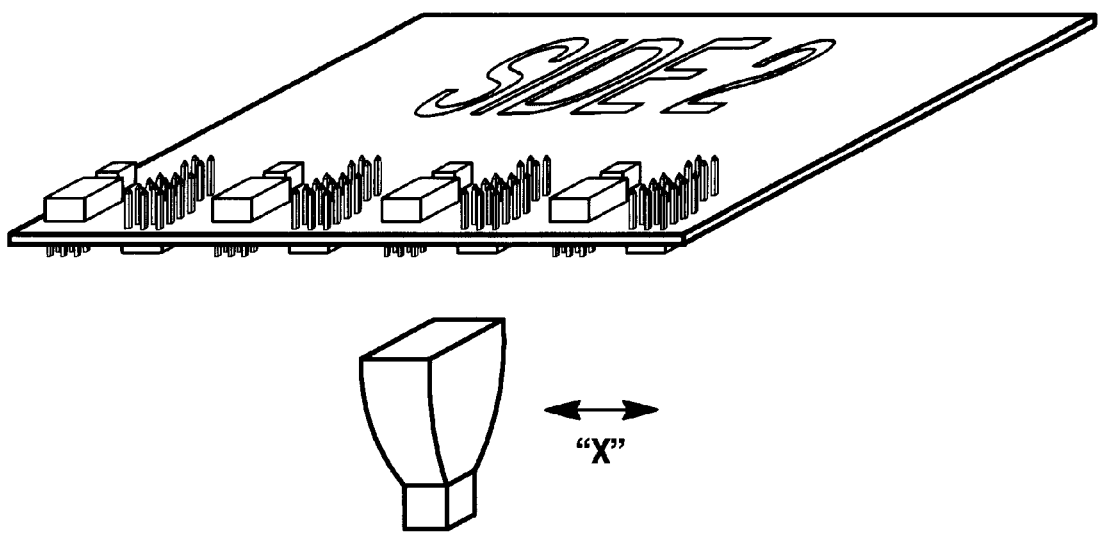
Figure 10E:
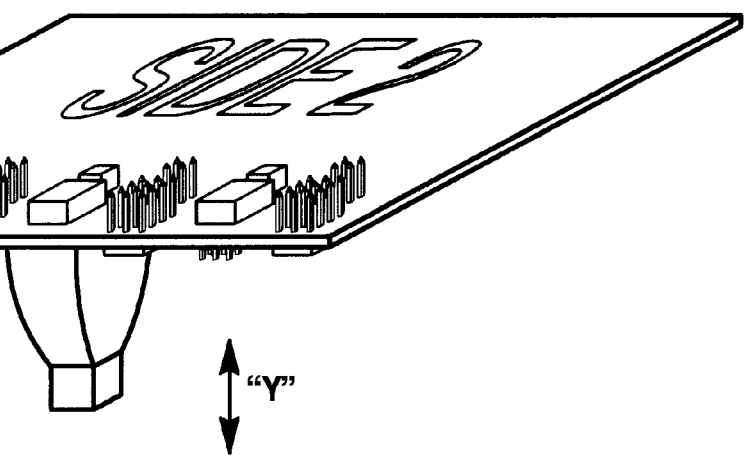

As illustrated in FIG. 10C, board 312 is then translated upwardly in the positive "Y" direction. It is then translated sidewardly in the positive "X" direction as is illustrated in FIG. 10D to a position wherein solder head 320 corresponds in position to electronic components 314C and 314D. The board 312 is then moved downwardly to a position adjacent solder fountain head by movement in the negative "Y" direction as illustrated in FIG. 10E. These steps are repeated in order to apply solder to the leads of remaining electronic components 314E and 314F and for electronic components 314G and 314H.

In other words, the Side 1 components are soldered using a single pass procedure (FIG. 10A). A first set of Side 2 components are then soldered using solder fountain head 320 (FIG. 10B). The board is then translated in the positive "Y" direction (FIG. 10C). The board is then translated in the positive "X" direction (FIG. 10D). Finally, the board is translated in the negative "Y" direction, and the next set of Side 2 components is then soldered. The board is continued to be indexed in this manner until all Side 2 components have been soldered. Although the method has been described with reference to movement of the board with respect to a stationary solder head, it is also contemplated that the solder head can instead be moved with respect to a stationary board.

It has been discovered that the apparatus and method for soldering according to this invention confers several significant advantages. Firstly, the apparatus and method require no additional labor because the shield connected to the wall of the solder head will follow the solder fountain head throughout the operation. Accordingly, the apparatus and method need not require additional labor as compared to a conventional fountain soldering process. Also, there is no additional time requirement for implementation of the method. Moreover, the results of the apparatus and method are highly repeatable in that the shield of the solder head can reliably prevent solder from contacting an adjacent component body. Finally, the apparatus and method are significantly effective in use by reducing the occurrence of contact between solder and adjacent components and thereby reducing the occurrence of damage to adjacent components. Moreover, the shield can be made of a more insulative material or, alternatively, a material that draws heat away from the surface that is closest to the adjacent component.

Although this invention has been described with reference to various embodiments selected for illustration in the figures, it will be appreciated that additional modifications and variations can be made without departing from the spirit or scope of this invention. It will be appreciated that the configuration of the solder head itself can be varied in both its shape and size and material. Although the solder head has been described with two opposed shields, it is contemplated that the solder head need have only a single shield or can have more than two shields, depending upon the configuration and spacing of the components on the circuit board. For example, although shields 326 are positioned adjacent wall portions 324A and 324B of wall 324, a single shield 326 can be used adjacent one of the wall portions or, alternatively, shields 326 can be positioned adjacent to any combination of wall portions 324A–324D. Also, the shield can take the form of a continuous wall extending fully around the perimeter of wall 324, if desired.

Although the invention has been described with reference to the soldering of electronic components such as integrated circuit chips to a printed circuit board, it will be appreciated that this invention applies to the soldering of any printed circuit board component to a printed circuit board. Also, although the invention has been described with reference to the protection of adjacent electronic components from exposure to solder, the adjacent component protected according to this invention can be any printed circuit board component. For example, the component to be soldered or protected can be any mechanical, electrical, or electromechanical device. Specific examples include polymeric or metallic brackets, connectors, logic packages (e.g., resistors, capacitors, etc.), or other components that may be positioned on printed circuit boards.

Also, it will be appreciated that the shield or shields can be connected to wall 324 in a wide variety of manners. Although a web 330 is utilized to connect shields 326 to wall portions 324A and 324B as illustrated in FIG. 5, it is contemplated that the shields can be connected in a wide variety of manners and configurations. Although an integral web 330 is utilized in the illustrated embodiment, a member connecting the shield to the wall can be a releasable mechanical fastener to permit disassembly or adjustment of the shield with respect to the wall. Also, any number of connecting members can be utilized.

It is contemplated that additional variations and modifications can be made without departing from the scope of the invention. Accordingly, the invention is separately defined in the appended claims.

What is claimed is:

1. A solder head adapted to direct the flow of solder from a solder fountain, said solder head comprising:
    a wall forming a passage through which solder can flow upwardly and having an edge portion over which solder can flow from said passage; and
    a shield connected to said wall, said shield and said wall at least partially defining an overflow passage through which solder can flow downwardly, said shield being configured to prevent contact between solder and a component proximal said solder head.

2. A solder head as recited in claim 1, wherein said shield extends beyond said edge portion of said wall to provide a gap between said edge portion of said wall and a circuit board when said solder head is positioned proximal the circuit board.

3. A solder head as recited in claim 1, wherein said shield extends substantially parallel to a portion of said wall of said solder head.

4. A solder head as recited in claim 1, said wall forming a rectangular passage.

5. A solder head as recited in claim 1, comprising a plurality of shields positioned along portions of said wall.

6. A solder head as recited in claim 1, further comprising a member connector extending from said shield to said wall to provide a connection therebetween.

7. A solder head as recited in claim 6, said member comprising a web extending outwardly from said wall to provide said connection.

8. A system for soldering a component to a circuit board said system comprising:
- a solder fountain;
- a solder head connected to said solder fountain, said solder head including a wall forming a passage through which solder can flow upwardly and having an edge portion over which solder can flow from said passage;
- said solder head also including a shield connected to said wall, said shield and said wall at least partially defining an overflow passage through which solder can flow downwardly;
- said solder head being positionable proximal said circuit board to facilitate soldering of said component to said circuit board, and said shield being positionable between said wall of said solder head and an adjacent component to prevent contact between solder flowing over said wall of said solder head and said adjacent component.

9. A system as recited in claim 8, wherein said shield extends beyond said edge portion of said wall to provide a gap between said edge portion of said wall and said circuit board when said solder head is positioned proximal said circuit board.

10. A system as recited in claim 8, wherein said shield extends substantially parallel to a portion of said wall of said solder head.

11. A system as recited in claim 8, wherein said wall forms a rectangular passage.

12. A system as recited in claim 8, comprising a plurality of shields positioned along portions of said wall.

13. A system as recited in claim 8, further comprising a member extending from said shield to said wall to provide a connection therebetween.

14. A system as recited in claim 13, said member comprising a web extending outwardly from said wall to provide said connection.

15. A method for soldering a component to a circuit board and for preventing contact between solder and an adjacent component, said method comprising the steps of:
- (a) providing a solder fountain;
- (b) connecting a soldering head to the solder fountain, the solder head including a wall forming a passage and an edge portion, the solder head also including a shield connected to said wall, said shield and said wall at least partially defining an overflow passage;
- (c) positioning the solder head proximal the circuit board and the shield between the wall of the solder head and the adjacent component;
- (d) urging solder upwardly through the passage formed by the wall, over the edge portion of the wall, and downwardly through the overflow passage defined between the wall and the shield, thereby preventing contact between the solder flowing over the edge portion of the wall and the adjacent component.

16. A method as recited in claim 15, further comprising the step of repositioning said solder head and another component proximal one another and repeating said positioning and urging steps.

17. A method as recited in claim 16, said repositioning step comprising moving said solder head and said circuit board away from one another.

18. A method as recited in claim 17, said repositioning step comprising moving said circuit board with respect to said solder head.

19. A method as recited in claim 17, said repositioning step comprising moving said solder head with respect to said circuit board.

20. A method as recited in claim 15, further comprising the preliminary step of soldering at least one adjacent component to an opposite side of said circuit board.

* * * * *